(12) United States Patent
Sasaki (10) Patent No.: US 7,176,384 B2
(45) Date of Patent: Feb. 13, 2007

(54) ELECTRONIC COMPONENT

(75) Inventor: Satoshi Sasaki, Yuri-gun (JP)

(73) Assignee: TDK Corporation, Tokyo (JP)

( * ) Notice: Subject to any disclaimer, the term of this patent is extended or adjusted under 35 U.S.C. 154(b) by 141 days.

(21) Appl. No.: 10/984,794

(22) Filed: Nov. 10, 2004

(65) Prior Publication Data
US 2005/0122661 A1 Jun. 9, 2005

(30) Foreign Application Priority Data
Nov. 11, 2003 (JP) ............................. 2003-381654

(51) Int. Cl.
*H01R 12/04* (2006.01)
*H05K 1/11* (2006.01)
(52) U.S. Cl. ...................................... 174/262; 361/792
(58) Field of Classification Search ........ 174/262–266; 361/792–795
See application file for complete search history.

(56) References Cited

U.S. PATENT DOCUMENTS 4,663,497 A * 5/1987 Reimann ..................... 174/264
5,003,131 A * 3/1991 Morikawa et al. ........... 174/261
5,321,211 A * 6/1994 Haslam et al. ............... 174/262
5,331,116 A * 7/1994 Haslam et al. ............... 174/250

FOREIGN PATENT DOCUMENTS

| JP | A-2001-076952 | 3/2001 |
| JP | A-2001-260349 | 9/2001 |
| JP | A-2002-019102 | 1/2002 |
| JP | A-2002-254634 | 9/2002 |

* cited by examiner

*Primary Examiner*—Dean A. Reichard
*Assistant Examiner*—Jeremy C. Norris
(74) *Attorney, Agent, or Firm*—Oliff & Berridge, PLC (57) ABSTRACT

In a stack-type piezoelectric device, a separator made of a material capable of preventing solder leaching is buried in a terminal electrode so as to block the whole of an aperture of a through hole. For this reason, it is feasible to securely prevent an electroconductive member in the through hole from dissolving into a molten solder, during connection of a lead wire to an outside layer of the terminal electrode by the solder, and to securely prevent breakage of electrical connection in the through hole.

4 Claims, 11 Drawing Sheets

ELECTRONIC COMPONENT

BACKGROUND OF THE INVENTION

1. Field of the Invention

The present invention relates to an electronic component using through holes for electrical connection.

2. Related Background Art

An example of the conventional electronic components of this type is a stack-type piezoelectric device, for example, as described in Japanese Patent Application Laid-Open No. 2002-254634. This stack-type piezoelectric device consists of an alternate stack of piezoelectric layers in each of which a number of individual electrodes are formed in a pattern, and piezoelectric layers in each of which a common electrode is formed in a pattern, and the individual electrodes aligned in the thickness direction of the stack-type piezoelectric device are connected by electroconductive members through through holes formed in the piezoelectric layers.

In this stack-type piezoelectric device, lead wires for connection to a drive power supply or the like are soldered to respective terminal electrodes formed on the uppermost piezoelectric layer. When a voltage is applied between predetermined individual electrodes and common electrodes through the lead wires, active parts (portions to be distorted by piezoelectric effect) corresponding to the predetermined individual electrodes in the piezoelectric layers are selectively displaced.

SUMMARY OF THE INVENTION

In the stack-type piezoelectric device as described above, the electroconductive member in the through hole formed under each terminal electrode can dissolve into a molten solder (so called solder leaching) during the soldering of the lead wire to the terminal electrode, so as to cause breakage of electrical connection in the through hole.

The present invention has been accomplished in view of such circumstances and an object of the present invention is to provide an electronic component capable of preventing an electroconductive member in a through hole from dissolving into a molten solder during soldering of a lead wire or the like to a terminal electrode connected to the electroconductive member in the through hole.

In order to achieve the above object, an electronic component according to the present invention comprises a substrate in which a through hole is formed; an electroconductive member placed in the through hole; a terminal electrode formed on a surface of the substrate so as to cover an aperture of the through hole, and connected to the electroconductive member; and a separator formed in the terminal electrode, wherein the separator comprises a material capable of preventing solder leaching and faces the aperture of the through hole in the terminal electrode.

In this electronic component, the separator facing the aperture of the through hole is formed in the terminal electrode formed on the surface of the substrate so as to cover the aperture of the through hole, and connected to the electroconductive member in the through hole. Since this separator comprises the material capable of preventing the solder leaching (i.e., a material unlikely to dissolve into the molten solder), the electroconductive member in the through hole can be prevented from dissolving into the molten solder during soldering of a lead wire or the like to the terminal electrode.

The separator is preferably formed so as to block the whole of the aperture in a penetrating direction of the through hole. This makes it feasible to more securely prevent the electroconductive member in the through hole from dissolving into the molten solder.

Preferably, the terminal electrode has an inside layer formed on the surface of the substrate, and an outside layer covering a surface of the inside layer, and the separator is formed on the surface of the inside layer between the inside layer and the outside layer. This permits the separator to be readily and accurately formed at the position opposite to the aperture of the through hole in the terminal electrode.

The separator is preferably made of a material having substantially the same composition as the substrate. When the material having substantially the same composition as the substrate is used for the separator in this manner, the separator can be efficiently formed.

Furthermore, a lead wire is preferably connected to the terminal electrode by a solder. In this electronic component, as described above, the electroconductive member in the through hole can be prevented from dissolving into the molten solder, during soldering of the lead wire to the terminal electrode, so as to prevent breakage of electrical connection in the through hole.

DESCRIPTION OF THE PREFERRED EMBODIMENTS

The preferred embodiments of the electronic component according to the present invention will be described below in detail with reference to the drawings.

Figure 1:
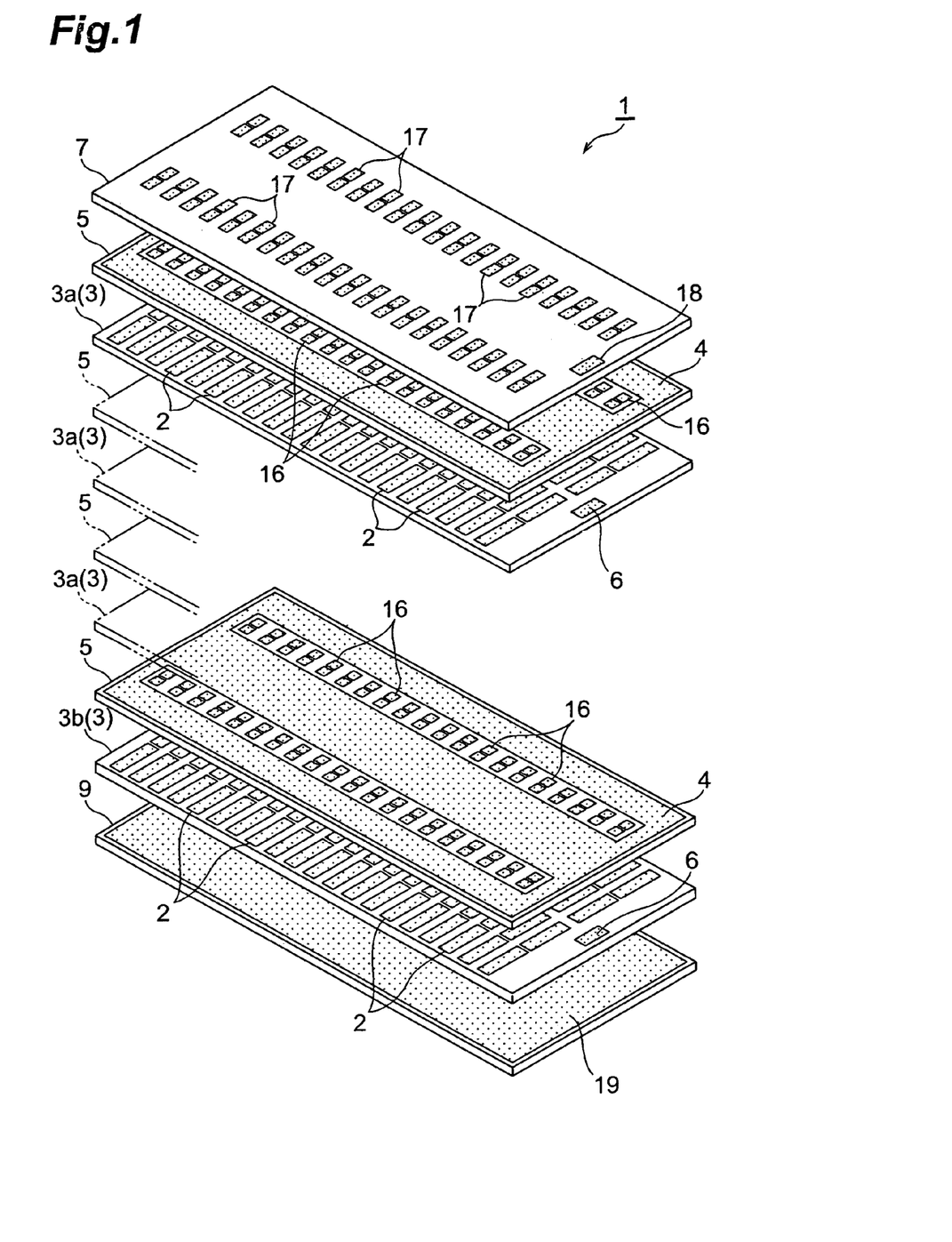
FIG. 1 is an exploded perspective view showing a stack-type piezoelectric device as an embodiment of the electronic component according to the present invention.

FIG. 1 is an exploded perspective view showing a stack-type piezoelectric device as an embodiment of the electronic component according to the present invention. As shown in the same figure, the stack-type piezoelectric device 1 consists of an alternate stack of piezoelectric layers 3 in each of which individual electrodes 2 are formed, and piezoelectric layers 5 in each of which a common electrode 4 is formed; a piezoelectric layer 7 in which terminal electrodes 17, 18 are formed; and a piezoelectric layer 9 as a base, in structure in which the alternate stack of piezoelectric layers 3 and piezoelectric layers 5 are vertically sandwiched between the piezoelectric layer 7 and the piezoelectric layer 9.

Each piezoelectric layer 3, 5, 7, 9 consists primarily of a ceramic material such as lead zirconate titanate and is formed, for example, in a rectangular thin plate shape of "10 mm×30 mm and 30 µm thick." The individual electrodes 2 and common electrodes 4 are made of a material consisting primarily of silver and palladium, and are formed in a pattern by screen printing. This also applies similarly to each of electrodes described below, except for the terminal electrodes 17, 18.

Figure 2:
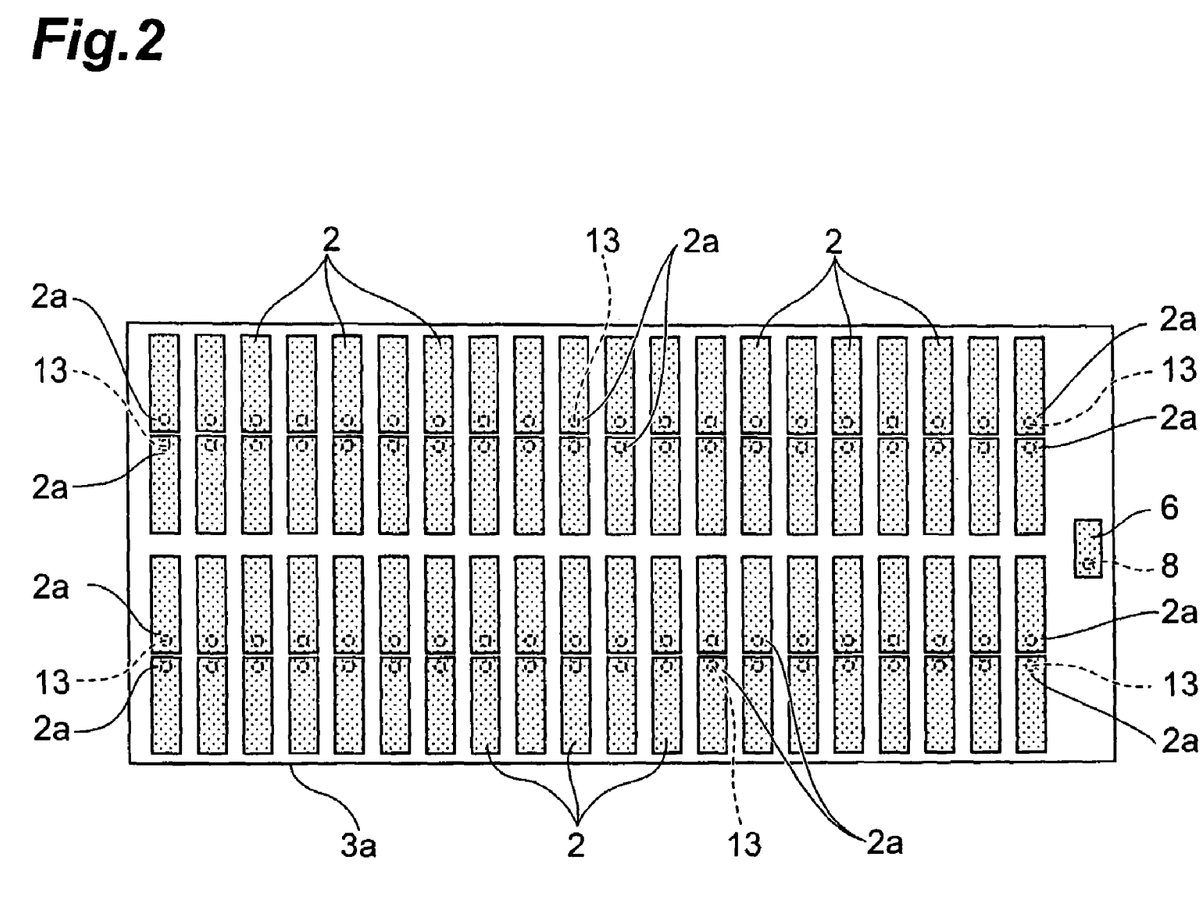
FIG. 2 is a plan view of the third, fifth, and seventh piezoelectric layers in the stack-type piezoelectric device shown in FIG. 1.

In this stack-type piezoelectric device 1, a number of rectangular individual electrodes 2 are arranged in a matrix, as shown in FIG. 2, on the upper surfaces of the third, fifth, and seventh piezoelectric layers 3a as counted from the uppermost piezoelectric layer 7. Each individual electrode 2 is placed so that the longitudinal direction thereof is perpendicular to the longitudinal direction of the piezoelectric layer 3a, and adjacent individual electrodes 2, 2 are placed with a predetermined space to achieve electrical independence of each other and to prevent interference between each other's vibrations.

Let the longitudinal direction of the piezoelectric layers 3a be a row direction and the direction perpendicular to the longitudinal direction be a column direction. Then the individual electrodes 2 are arranged, for example, in a matrix of four rows and seventy five columns (the drawing shows a matrix of four rows and twenty columns for clarity). This matrix arrangement of many individual electrodes 2 enables efficient arrangement for the piezoelectric layers 3a, and it is thus feasible to achieve miniaturization of the stack-type piezoelectric device 1 or high integration of individual electrodes 2, while maintaining the area of active parts contributing to vibration in the piezoelectric layers 3a.

The individual electrodes 2 in the first row and in the second row have their respective ends opposed between the first row and the second row, as connection ends 2a, and are connected to electroconductive members in through holes 13 formed immediately below the connection ends 2a in the piezoelectric layer 3a. Similarly, the individual electrodes 2 in the third row and in the fourth row have their respective ends opposed between the third row and the fourth row, as connection ends 2a, and are connected to electroconductive members in through holes 13 formed immediately below the connection ends 2a in the piezoelectric layer 3a.

Furthermore, a relay electrode 6 for electrical connection between common electrodes 4, 4 of the piezoelectric layers 5 located up and down is formed in an edge region on the upper surface of each piezoelectric layer 3a. This relay electrode 6 is connected to an electroconductive member in a through hole 8 formed immediately below it in the piezoelectric layer 3a.

Figure 3:
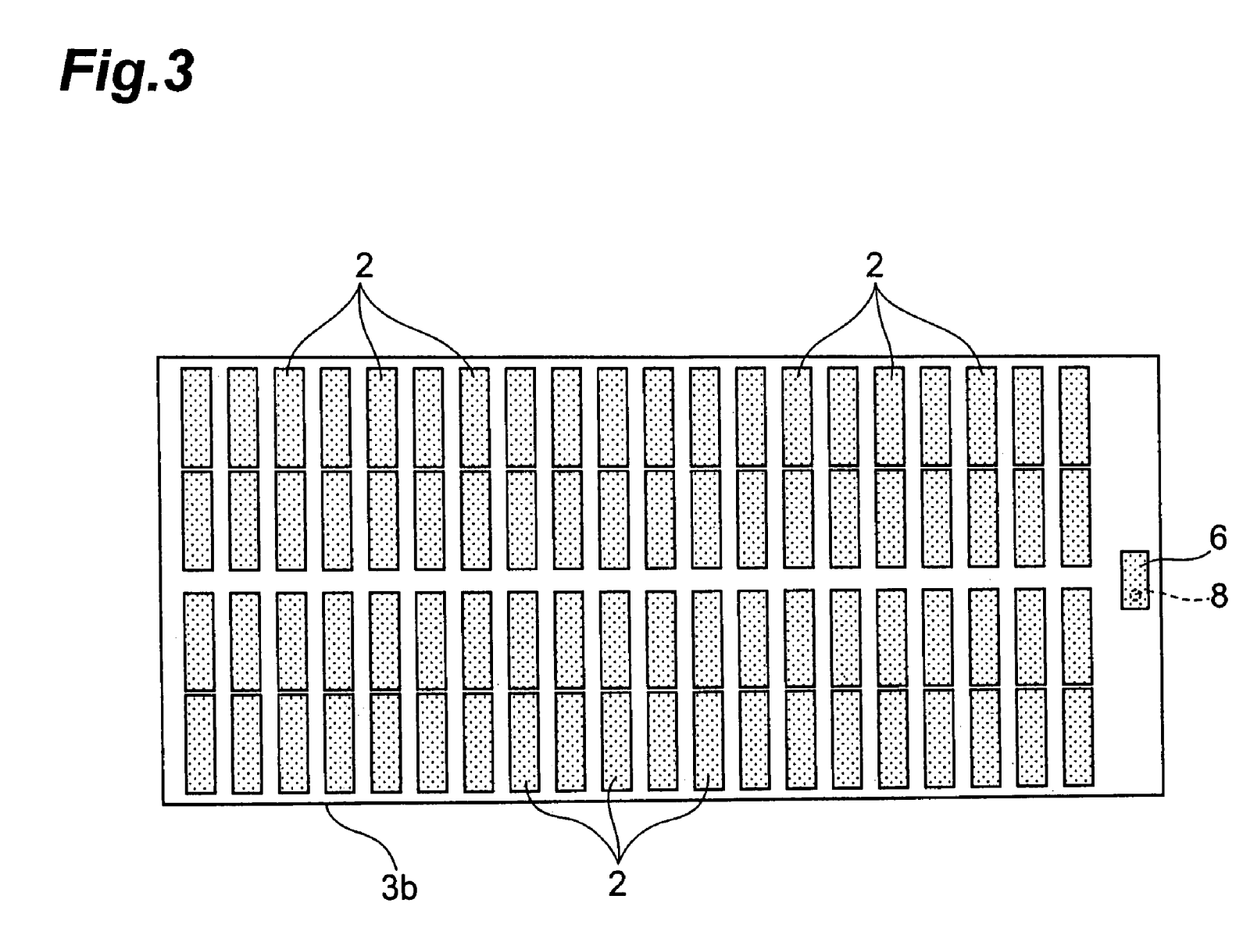
FIG. 3 is a plan view of the ninth piezoelectric layer in the stack-type piezoelectric device shown in FIG. 1.

Individual electrodes 2 are also arranged in a matrix on the upper surface of the piezoelectric layer 3b located as the ninth layer, as in the third, fifth, and seventh piezoelectric layers 3a described above. However, the ninth piezoelectric layer 3b is different from the aforementioned piezoelectric layers 3a in that the through holes 13 are not formed, as shown in FIG. 3.

Figure 4:
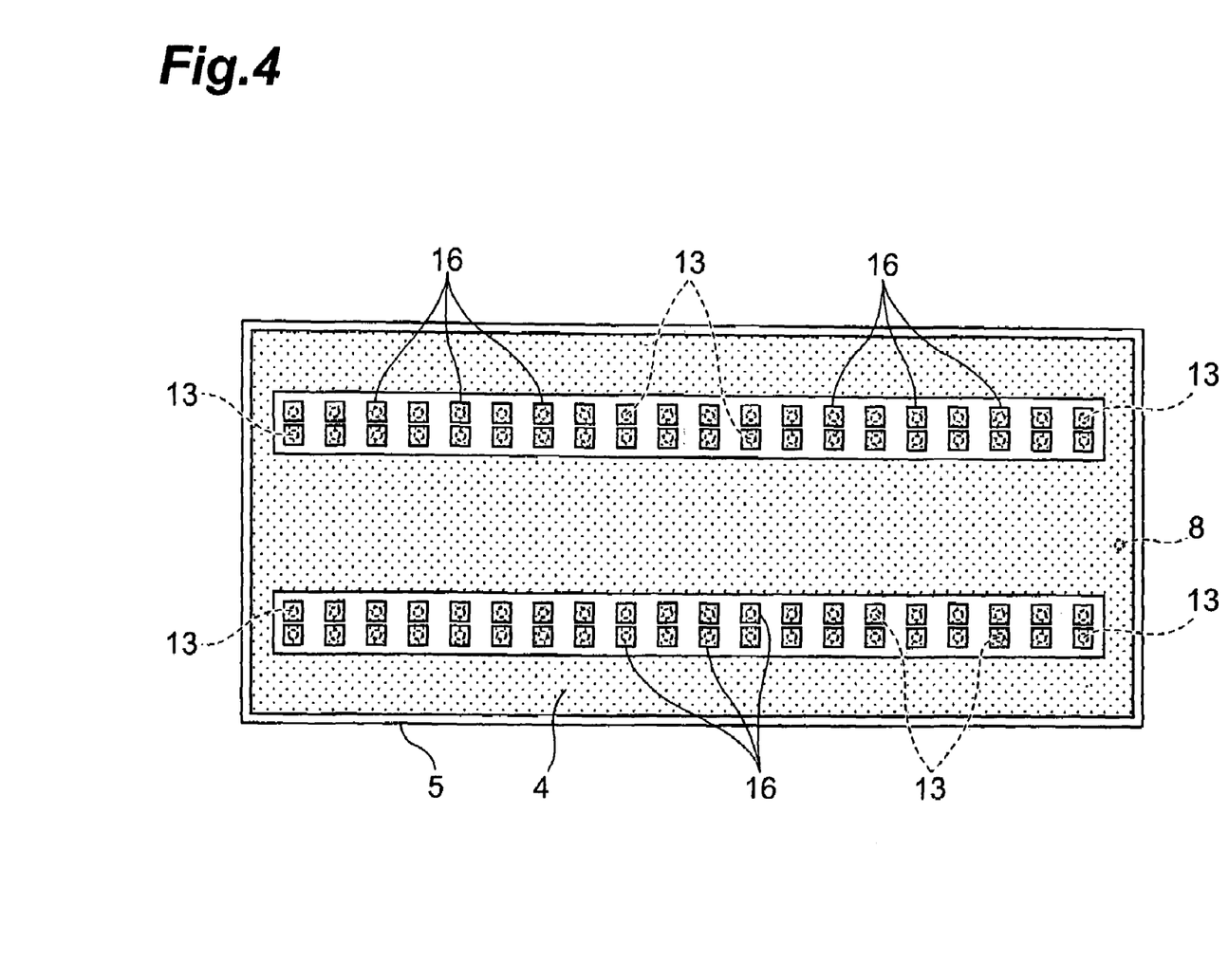
FIG. 4 is a plan view of the second, fourth, sixth, and eighth piezoelectric layers in the stack-type piezoelectric device shown in FIG. 1.

As shown in FIG. 4, relay electrodes 16 are formed so as to face the respective connection ends 2a of the piezoelectric layers 3a in the thickness direction of the stack-type piezoelectric device 1, on the upper surfaces of the second, fourth, sixth, and eighth piezoelectric layers 5 as counted from the uppermost piezoelectric layer 7 (the "thickness direction of stack-type piezoelectric device 1," i.e., "thickness direction of piezoelectric layers 3, 5" will be referred to hereinafter simply as "thickness direction"). Each relay electrode 16 is connected to an electroconductive member in a through hole 13 formed immediately below the relay electrode in the piezoelectric layer 5.

Furthermore, a common electrode 4 is formed on the upper surface of each piezoelectric layer 5. This common electrode 4 surrounds each of a group of relay electrodes 16 in the first row and in the second row and a group of relay electrodes 16 in the third row and in the fourth row, with a predetermined space, and overlaps portions except for the connection ends 2a of the respective individual electrodes 2, when viewed from the thickness direction. This permits the whole of portions facing the portions except for the connection ends 2a of the respective individual electrodes 2 in the piezoelectric layers 3, 5 to be effectively used as active parts contributing to vibration. The common electrode 4 is formed with a predetermined space from the peripheral part of each piezoelectric layer 5, and is connected to an electroconductive member in a through hole 8 formed in the piezoelectric layer 5 so as to face the relay electrode 6 of the piezoelectric layer 3 in the thickness direction.

Figure 5:
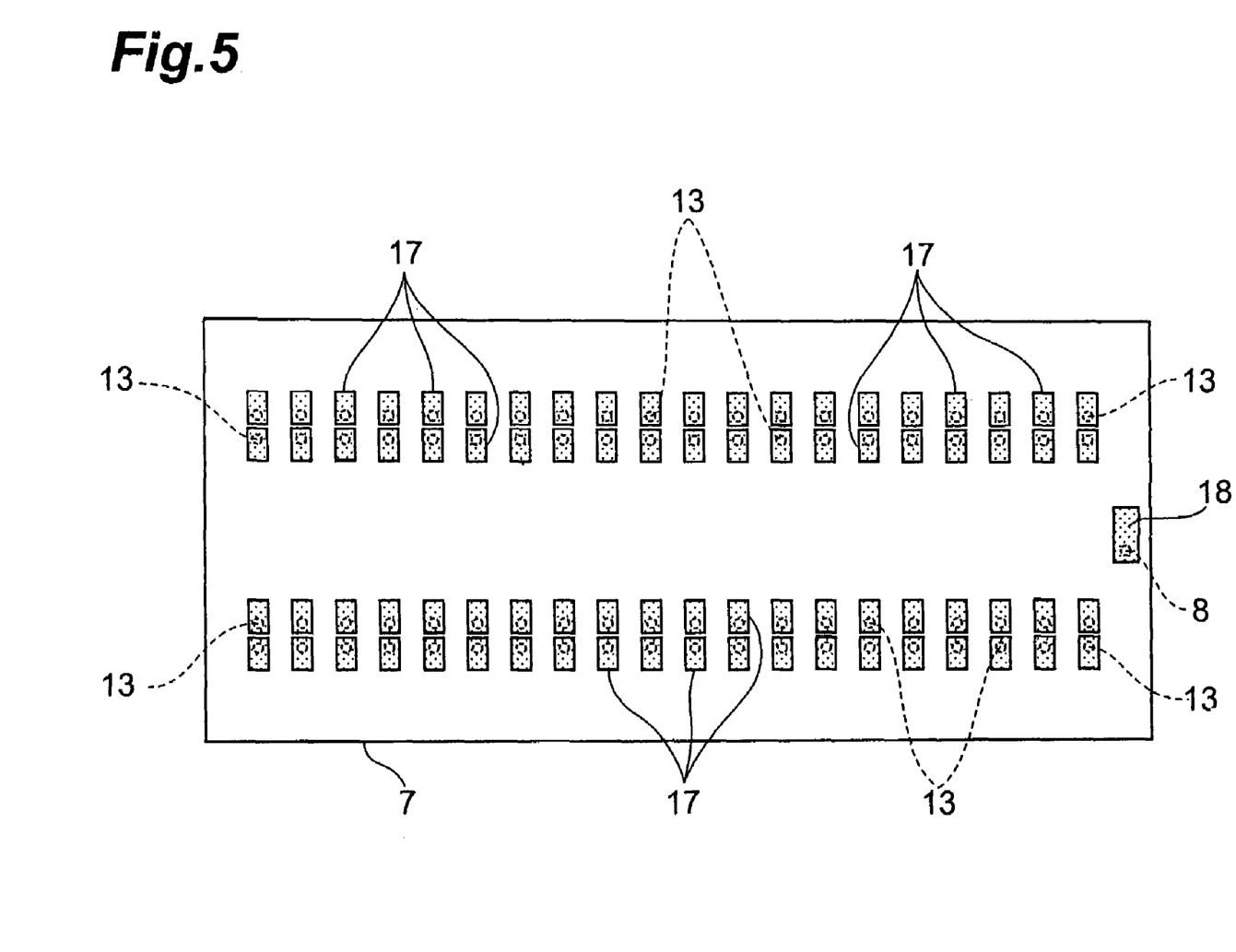
FIG. 5 is a plan view of the uppermost piezoelectric layer in the stack-type piezoelectric device shown in FIG. 1.

As shown in FIG. 5, terminal electrodes 17 are formed so as to face the corresponding relay electrodes 16 of the piezoelectric layer 5 in the thickness direction, on the upper surface of the uppermost piezoelectric layer 7, and a terminal electrode 18 is formed so as to face the relay electrode 6 of the piezoelectric layer 3 in the thickness direction. Each terminal electrode 17 is connected to an electroconductive member in a through hole 13 formed immediately below it in the piezoelectric layer 7, and the terminal electrode 18 is connected to an electroconductive member in a through hole 8 formed immediately below it in the piezoelectric layer 7. Lead wires for connection to a drive power supply are soldered to these terminal electrodes 17, 18.

Figure 6:
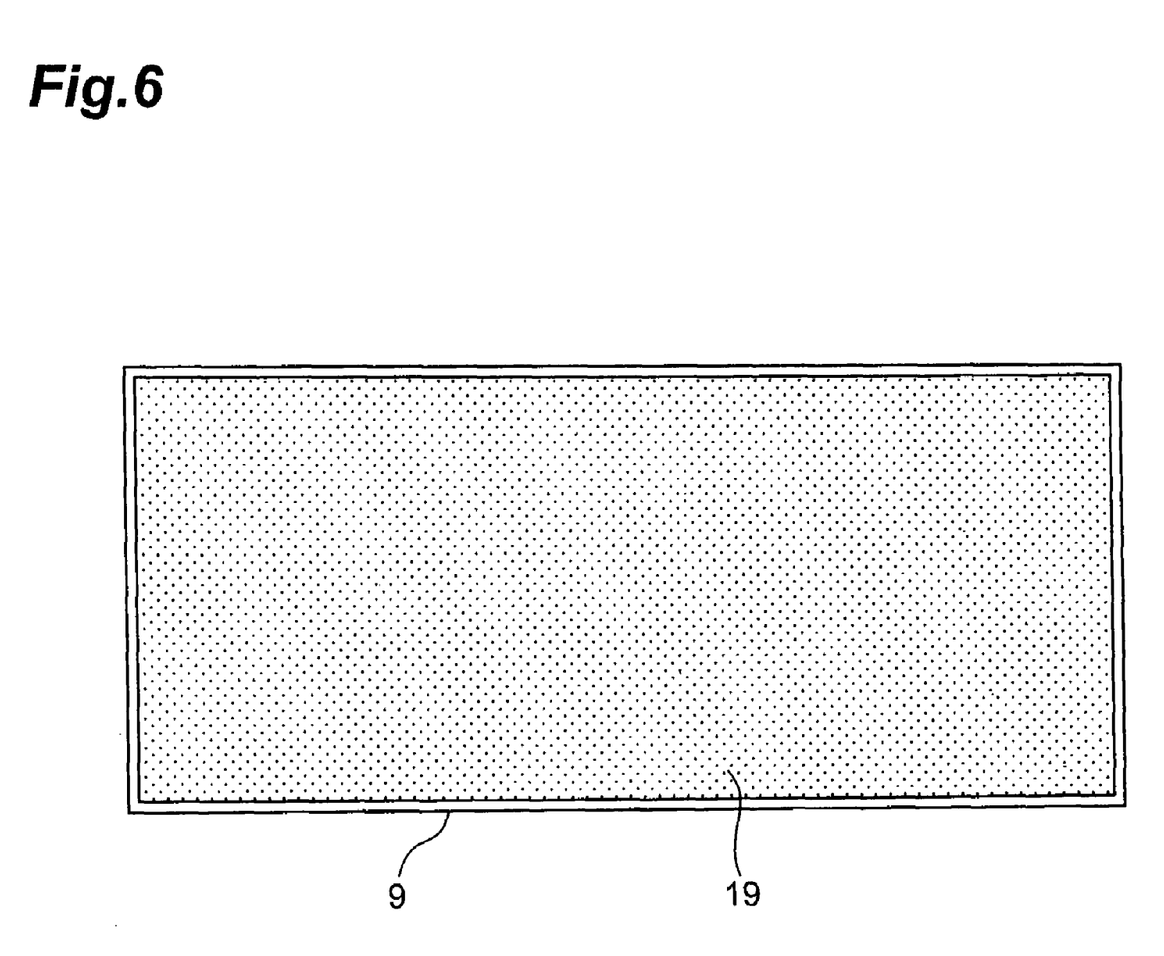
FIG. 6 is a plan view of the lowermost piezoelectric layer in the stack-type piezoelectric device shown in FIG. 1.

Furthermore, as shown in FIG. 6, a common electrode 19 of rectangular shape having the contour equivalent to that of the common electrode 4 of the piezoelectric layers 5 is formed with a predetermined space from the peripheral part of the piezoelectric layer 9, on the upper surface of the lowermost piezoelectric layer 9.

Figure 7:
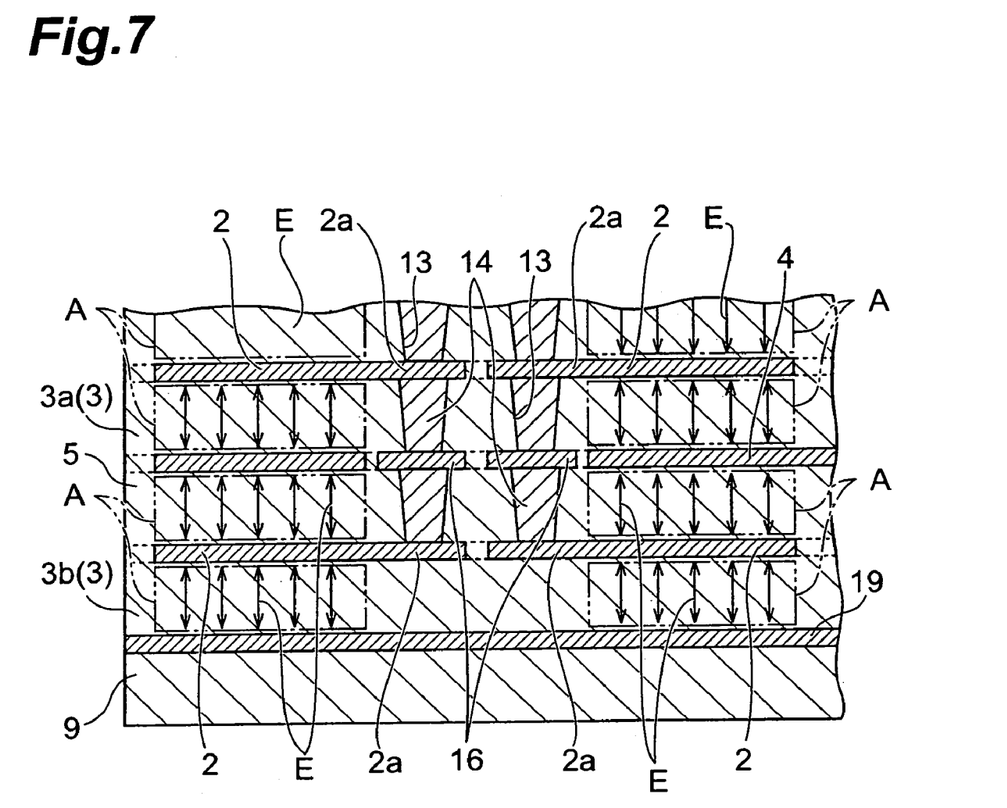
FIG. 7 is an enlarged sectional view along the direction normal to the longitudinal direction of the stack-type piezoelectric device shown in FIG. 1.

By the stack of piezoelectric layers 3, 5, 7, and 9 with the electrode patterns formed as described above, four individual electrodes 2 are aligned through the relay electrodes 16 in the thickness direction, for each terminal electrode 17 of the uppermost layer, and the electrodes 2, 16, and 17 thus aligned are electrically connected by the electroconductive members 14 in the through holes 13, as shown in FIG. 7. On the other hand, for the terminal electrode 18 of the uppermost layer, four common electrodes 4 and the common electrode 19 of the lowermost layer are aligned through the relay electrodes 6 in the thickness direction, and the electrodes 4, 6, 18, 19 thus aligned are electrically connected by the electroconductive members 14 in the through holes 8.

In this electrical connection in the stack-type piezoelectric device 1, when a voltage is applied between predetermined terminal electrode 17 and terminal electrode 18, the voltage is applied between the individual electrodes 2 aligned under the predetermined terminal electrode 17, and common electrodes 4, 19. This results in establishing electric fields E in the portions between individual electrodes 2 and common electrodes 4, 19, as shown in FIG. 7, in the piezoelectric layers 3, 5, whereby these portions are displaced as active parts A. By selecting a terminal electrode 17 to which a voltage is to be applied, therefore, it is feasible to displace the active parts A aligned under the selected terminal electrode 17, in the thickness direction, among the active parts A corresponding to the respective individual electrodes 2 arranged in the matrix. The stack-type piezoelectric device 1 is applied to the drive source of various devices involving small displacement, such as control of a valve of a micropump.

Figure 8:
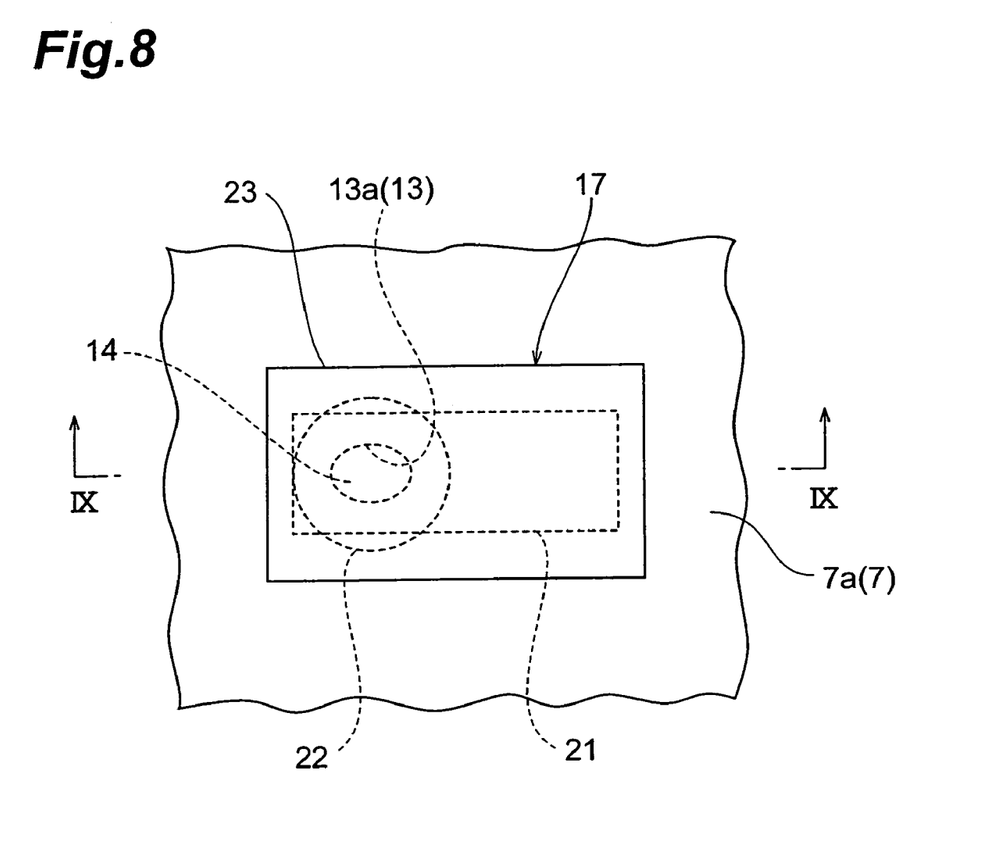
FIG. 8 is a plan view of a terminal electrode in the stack-type piezoelectric device shown in FIG. 1.

Next, the aforementioned terminal electrodes 17 will be described below in more detail. FIG. 8 is a plan view of a terminal electrode 17 and FIG. 9 a sectional view thereof along IX—IX line shown in FIG. 8.

Figure 9:
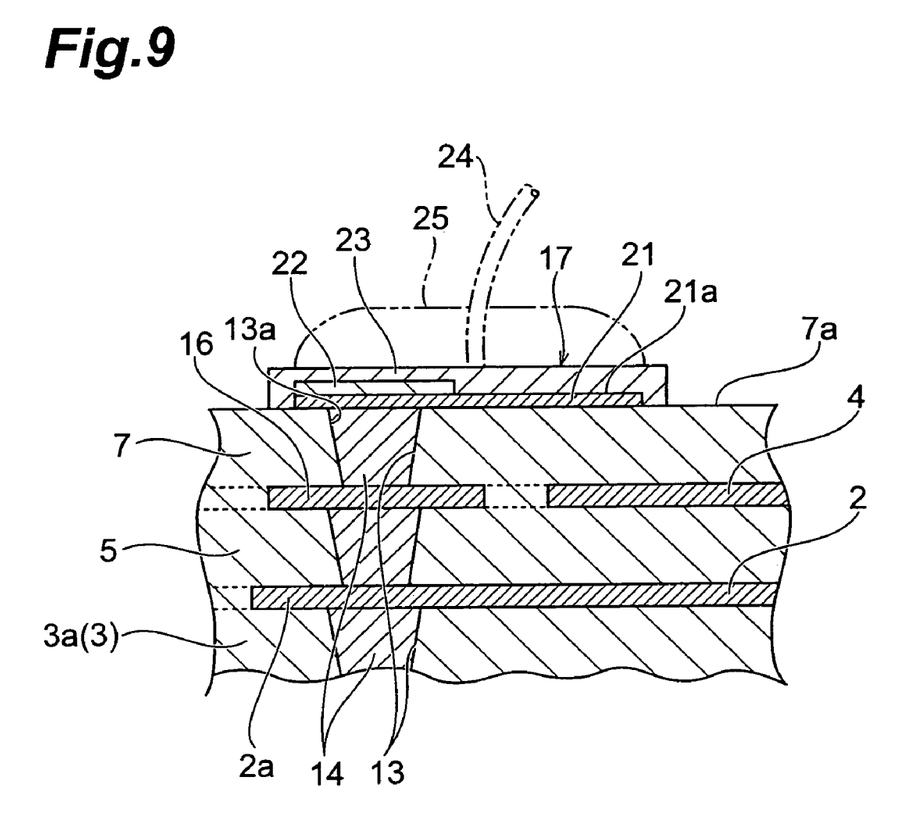
FIG. 9 is a sectional view along IX—IX line shown in FIG. 8.

As shown in FIGS. 8 and 9, the terminal electrode 17 has an inside layer 21 of rectangular shape formed on a surface 7a of piezoelectric layer (substrate) 7 so as to cover an aperture 13a of a through hole 13. This inside layer 21 is made of a material consisting primarily of silver and palladium, and is connected to an electroconductive member 14 placed in the through hole 13.

A separator 22 of circular shape made of a material consisting primarily of a ceramic material such as lead zirconate titanate is formed so as to block the whole of aperture 13a in the penetrating direction of the through hole 13 (i.e., the thickness direction of the piezoelectric layer 7), on a surface 21a of the inside layer 21. Furthermore, an outside layer 23 of rectangular shape made of a material consisting primarily of silver is formed so as to cover the surface 21a and separator 22, on the inside layer 21. The material consisting primarily of the ceramic material such as lead zirconate titanate is a material capable of preventing solder leaching (i.e., a material unlikely to dissolve into a molten solder).

In the stack-type piezoelectric device 1, as described above, the separator 22 made of the material capable of preventing solder leaching is buried in the terminal electrode 17 so as to block the whole of the aperture 13a of the through hole 13. For this reason, it is feasible to surely prevent the electroconductive member 14 in the through hole 13 from dissolving into a molten solder 25 during a work of connecting a lead wire 24 to the outside layer 23 of the terminal electrode 17 by the solder 25, as shown in FIG. 9, whereby it becomes feasible to securely prevent breakage of electrical connection in the through hole 13.

In the stack-type piezoelectric device 1, the separator 22 is formed on the surface 21a of the inside layer 21 between the inside layer 21 and the outside layer 23. For this reason, the separator 22 can be readily and accurately formed at the position where it can block the whole of the aperture 13a of the through hole 13 in the terminal electrode 17.

Since the separator 22 to block the whole of the aperture of the through hole 8 is also buried in the terminal electrode 18, the terminal electrode 18 also achieves the operational effect similar to that of the terminal electrode 17.

Next, a production procedure of the stack-type piezoelectric device 1 will be described. First, a substrate paste is prepared by mixing an organic binder, an organic solvent, etc. into a piezoelectric material consisting primarily of a ceramic material such as lead zirconate titanate, and green sheets for the respective piezoelectric layers 3, 5, 7, and 9 are formed using the substrate paste. An electroconductive paste is also prepared by mixing an organic binder, an organic solvent, etc. into a metal material consisting of silver and palladium in a predetermined proportion.

Subsequently, laser light is applied to predetermined positions on the green sheets for the respective piezoelectric layers 3, 5, 7, 9 to form the through holes 8, 13. Then filling screen print with the electroconductive paste is carried out into the through holes 8, 13 to form the electroconductive members 14. Thereafter, screen print with the electroconductive paste is carried out on the green sheets for the respective piezoelectric layers 3, 5, 9 to form the electrodes 2, 4, 6, 16, and 19. Screen print with the electroconductive paste is also carried out on the green sheet for the uppermost piezoelectric layer 7 to form the inside layers 21 as ground electrodes.

Furthermore, screen print with the substrate paste is carried out on the green sheet for the piezoelectric layer 7 to form the separators 22. Since the material having substantially the same composition as each piezoelectric layer 3, 5, 7, 9 is used for the separators 22, the separators 22 can be efficiently formed.

Subsequently, the green sheets with the electrode patterns thereon are stacked in the aforementioned order and pressed in the stack direction to fabricate a green laminate. This green laminate is degreased and baked, and thereafter baked electrodes of silver are placed on the sintered sheet for the piezoelectric layer 7 to form the outside layers 23. Thereafter, a polarization process is carried out to complete the stack-type piezoelectric device 1. Gold, copper, or the like may also be used as the material of the outside layers 23. The outside layers 23 may also be formed by another method such as sputtering, electroless plating, or the like.

Figure 10:
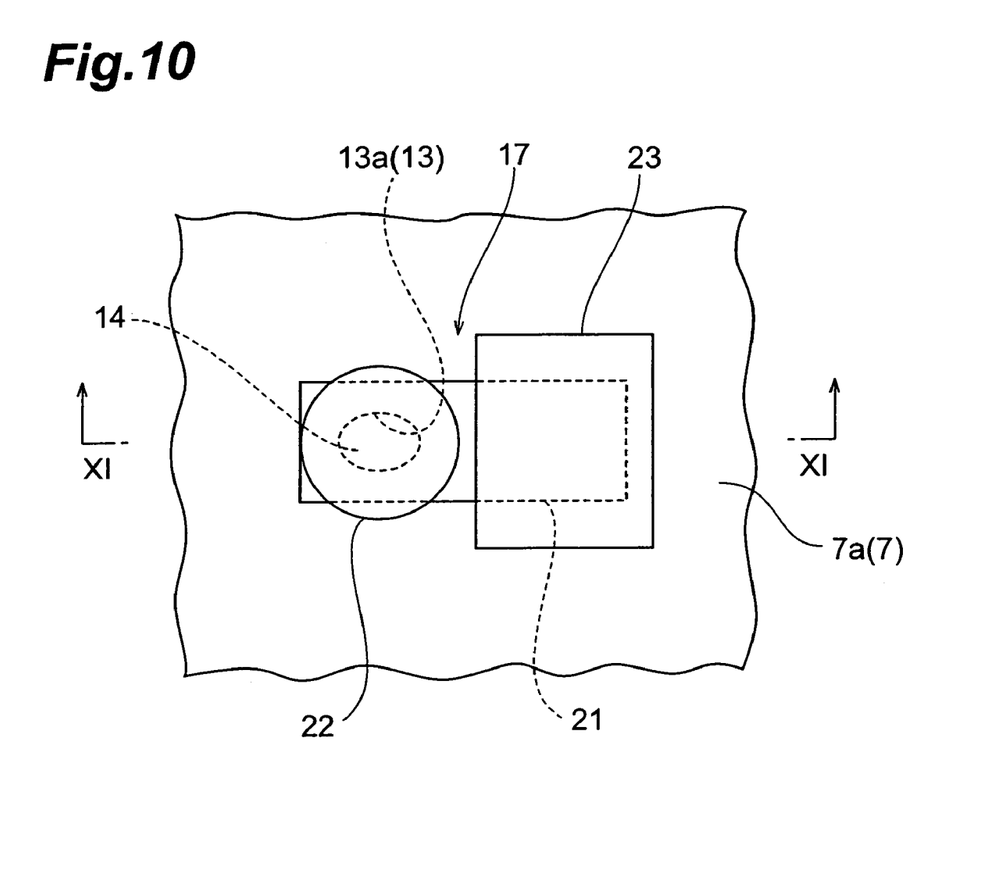
FIG. 10 is a plan view of a modification example of the terminal electrode in the stack-type piezoelectric device shown in FIG. 1.
Figure 11:
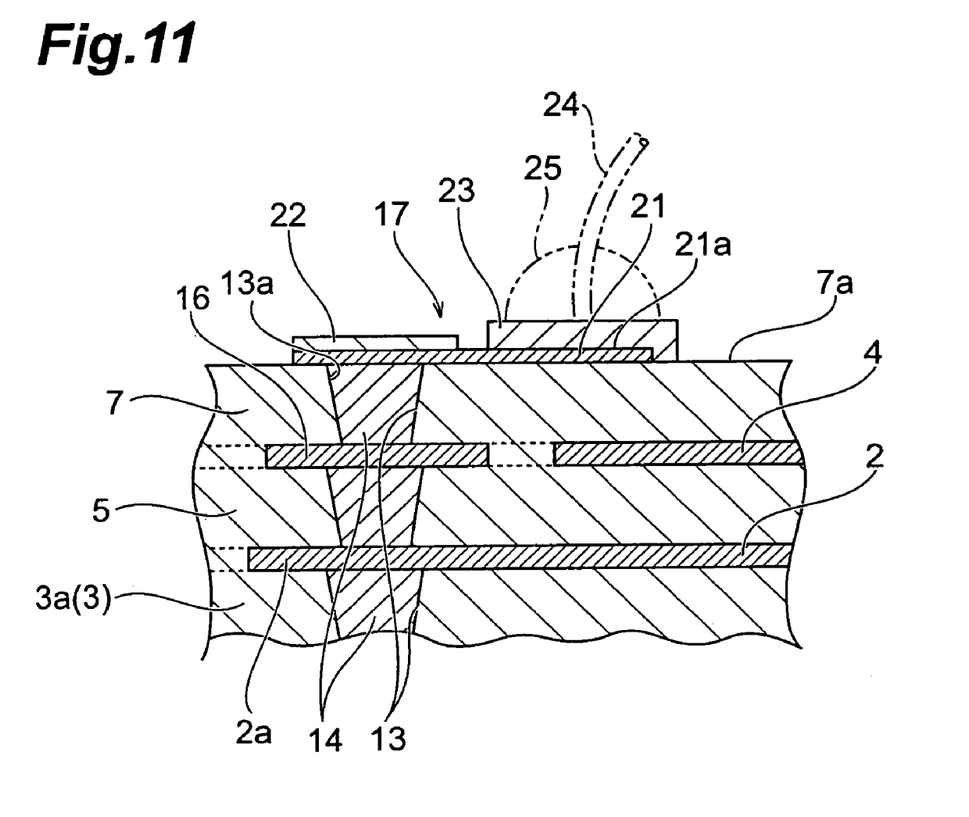
FIG. 11 is a sectional view along XI—XI line shown in FIG. 10.

The present invention is not limited to the above embodiment. For example, the above embodiment was directed to the case where the separator 22 was buried in each terminal electrode 17, but the separator 22 may be exposed to the outside. As an example, as shown in FIGS. 10 and 11, the outside layer 23 is formed so as to cover a portion without the separator 22 on the surface 21a of the inside layer 21, and a lead wire 24 is connected to this outside layer 23 by solder 25. In this configuration, even if the molten solder 25 flows over the aperture 13a of the through hole 13, the electroconductive member 14 in the through hole 13 can be prevented from dissolving into the molten solder 25.

The above embodiment was directed to the case where the separator 22 blocked the whole of the aperture 13a of the through hole 13, but the separator 22 does not always have to block the whole of the aperture 13a as long as it faces the aperture 13a. In this case, it is also feasible to prevent the electroconductive member 14 in the through hole 13 from dissolving into the molten solder, during soldering of the lead wire to the terminal electrode 17, when compared with the case without the separator 22 in the terminal electrode 17.

The material of the separator 22 does not have to be limited to the material consisting primarily of the ceramic material such as lead zirconate titanate, but it can be any material capable of preventing solder leaching, such as a vitreous material consisting primarily of $SiO_2$.

Furthermore, the present invention is also applicable to a variety of electronic components using through holes for electrical connection, besides the stack-type piezoelectric devices 1.

The present invention effectively prevents the electroconductive member in the through hole from dissolving into the molten solder, during soldering of the lead wire or the like to the terminal electrode connected to the electroconductive member in the through hole.

What is claimed is:
1. An electronic component comprising:
a substrate in which a through hole is formed;
an electroconductive member placed in the through hole;
a terminal electrode formed on a surface of the substrate so as to cover an aperture of the through hole, and connected to the electroconductive member; and
a separator formed in the terminal electrode, wherein the separator comprises a material capable of preventing solder leaching and that faces the aperture of the through hole in the terminal electrode, and the material has substantially the same composition as the substrate.

2. The electronic component according to claim 1, wherein the separator is formed so as to block the whole of the aperture in a penetrating direction of the through hole.

3. The electronic component according to claim 1, wherein the terminal electrode comprises an inside layer formed on the surface of the substrate, and an outside layer covering a surface of the inside layer, and wherein the separator is formed on the surface of the inside layer between the inside layer and the outside layer.

4. The electronic component according to claim 1, wherein a lead wire is connected to the terminal electrode by a solder.

* * * * *